(12) United States Patent
Na

(10) Patent No.: US 6,982,924 B2
(45) Date of Patent: Jan. 3, 2006

(54) DATA OUTPUT CONTROL CIRCUIT

(75) Inventor: Kwang-Jin Na, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/875,387

(22) Filed: Jun. 25, 2004

(65) Prior Publication Data

US 2005/0094443 A1    May 5, 2005

(30) Foreign Application Priority Data

Oct. 31, 2003    (KR)    ............... 10-2003-0076835

(51) Int. Cl.
*G11C 8/00*    (2006.01)
(52) U.S. Cl. ..................... 365/233; 365/194
(58) Field of Classification Search ............... 365/233, 365/194, 193, 226
See application file for complete search history.

(56) References Cited

U.S. PATENT DOCUMENTS

| 6,266,294 B1 * | 7/2001 | Yada et al. ............... 365/233 |
| 6,512,719 B2 * | 1/2003 | Fujisawa et al. ........... 365/233 |
| 6,707,758 B2 * | 3/2004 | Kono ....................... 365/233 |
| 6,850,458 B2 * | 2/2005 | Li .......................... 365/233 |

* cited by examiner

*Primary Examiner*—Anh Phung
(74) *Attorney, Agent, or Firm*—Mayer, Brown, Rowe & Maw LLP

(57) ABSTRACT

A data output control circuit for use in a synchronous semiconductor memory device including: a first data output enable signal generation unit for receiving an internal signal and generating a rising data output enable signal synchronizing with a rising edge of a DLL clock signal according to a CAS latency; and a second data output enable signal generation unit for receiving the rising data output enable signal and generating a falling data output enable signal synchronizing with a falling edge of the DLL clock signal.

7 Claims, 7 Drawing Sheets

DATA OUTPUT CONTROL CIRCUIT

FIELD OF INVENTION

The present invention relates to a semiconductor device; and, more particularly, to a data output control circuit for outputting data.

DESCRIPTION OF PRIOR ART

A semiconductor memory device has been continuously improved to increase its operational speed. One of methods to improve an operational speed of a semiconductor memory device is to make the semiconductor memory device operate in synchronization with an external clock signal. Therefore, a semiconductor memory device which operates in synchronization with the external clock signal, namely a synchronous semiconductor memory device, has been developed.

The synchronous semiconductor memory device performs a data access operation at a rising edge of the external clock signal. That is, the synchronous semiconductor memory device can perform the data access operation once within one cycle of the external clock signal.

Such a synchronous semiconductor memory device that performs the data access operation once within one cycle of the external clock signal is particularly called a single data rate (SDR) synchronous semiconductor memory device.

However, the SDR synchronous semiconductor memory device had to be more improved for use in a high speed system. Therefore, a double data rate (DDR) synchronous semiconductor memory device has been developed. The DDR synchronous semiconductor memory device performs the data access operation at a rising edge and a falling edge of the external clock signal. That is, the DDR synchronous semiconductor memory device performs the data access operation twice within one cycle of the external clock signal.

Since the DDR synchronous semiconductor memory device should perform the data access operation twice within one cycle of the external clock signal, a data access method used in the SDR synchronous semiconductor memory device can not be used in the DDR synchronous semiconductor memory device.

If a cycle of the external clock signal is 10 nano-seconds, the DDR synchronous semiconductor memory device has only about 6 nano-seconds for performing the data access operation because about 4 nano-seconds is spent for other operations such as raising and lowering edges of the external clock signal.

Since 6 nano-seconds is too short time for the DDR synchronous semiconductor memory device to internally handle a data at both edges of the external clock signal, the DDR synchronous semiconductor memory device performs a data access operation at both edges, i.e., a falling edge and a rising edge, of the external clock signal only when a data is inputted into or outputted from the DDR synchronous semiconductor memory device and, thus, the DDR synchronous semiconductor memory device internally performs the data access operation in synchronization with one of the both edges of the external clock signal.

Therefore, a new data access method is required for a data to be inputted into or outputted from the DDR synchronous semiconductor memory device.

For the synchronous semiconductor memory device, some technical terms are used. One of those technical terms is a column address strobe (CAS) latency.

The CAS latency (CL) is the ratio between column access time and a clock cycle time. That is, the CL shows how many cycles of the external clock signal are spent while performing a read operation of a semiconductor memory device. For instance, in case that the CL is 3, if a read command is inputted, a data corresponding to the read command is outputted from a memory cell array after 3 cycles of the external clock signal. Therefore, at an initial state of the synchronous semiconductor memory device, the CL is detected by the synchronous semiconductor memory device and is used for outputting a data.

Meanwhile, the data outputted from the memory cell array is stored in a data output buffer. Then, the data stored in the data output buffer is finally outputted from the synchronous semiconductor memory device in response to an activated data output enable signal. The data output enable signal is generated by delaying a read command performing signal for a time period corresponding to the CL, wherein the read command performing signal is generated in response to the read command. Therefore, the synchronous semiconductor memory device activates the data output enable signal after time of the CL is passed.

Herein, the synchronous semiconductor memory device uses an internal operating clock signal which is outputted from a delay locked loop (DLL). When the external clock signal is inputted to the synchronous semiconductor memory device in order to be used as the internal operating clock signal, there occurs a time error between the external clock signal and the internal operating clock signal. Therefore, the DLL is applied to the synchronous semiconductor memory device for synchronizing the internal operating clock signal with the external clock signal.

FIG. 1 is a block diagram showing a conventional synchronous semiconductor memory device.

As shown, the conventional synchronous semiconductor memory device includes an input buffer 10, a command decoder 20, a read operation timing control unit 30, a data output control unit 40, a data output buffer 50, a data output pad (DQ pad) 60, a delay locked loop (DLL) 70 and a memory core block 80.

The input buffer 10 receives a plurality of command signals such as a chip selection bar signal /CS, a row address strobe bar signal /RAS, a column address strobe bar signal /CAS and a write enable bar signal /WE for buffering and outputting those plurality of command signals. The command decoder 20 receives the plurality of command signals from the input buffer 10 for decoding the plurality of command signals and, thus, to output a control signal such as a read command signal rd.

The read operation timing control unit 30 receives the read command signal rd for generating a read command performing signal casp_rd which corresponds to the read command signal rd. There is a predetermined time difference between a timing of receiving the read command signal rd and a timing of generating the read command performing signal casp_rd. The predetermined time difference corresponds to clock cycles of a clock signal iclk, where the clock cycles of the clock signal iclk is an additive latency (AL).

Herein, the AL is the number of spent clock cycles of the clock signal iclk while a tRCD (RAS to CAS delay) is passed after the read command signal rd is inputted to the read operation timing control unit 30. The tRCD is a time difference between an input timing of a row address and an input timing of a column address.

When the row address is inputted, the conventional synchronous semiconductor memory device is activated, and, then, the column address is inputted after the tRCD is passed. However, the read command signal rd is inputted prior to the column address after the row address is inputted.

That is, the AL is a time difference between an input timing of the read command signal rd and an input timing of the column address.

The memory core block 80 outputs a data to the data output buffer 50 in response to the read command performing signal casp_rd, where the data inputted to the data output buffer 50 corresponds to an address signal addr.

The DLL 70 generates two delay locked clock signals, i.e., a delay locked falling edge clock signal fclk_dll and a delay locked rising edge clock signal rclk_dll by delay locking the clock signal iclk. The delay locked falling edge clock signal fclk_dll and the delay locked rising edge clock signal rclk_dll are used for a data to be outputted from the conventional synchronous semiconductor memory device synchronizing with a falling edge and a rising edge of an external clock signal.

The data output control unit 40 receives the read command performing signal casp_rd, the clock signal iclk, the delay locked falling edge clock signal fclk_dll and the delay locked rising edge clock signal rclk_dll for generating two data output enable signals, i.e., a rising data output enable signal routen and a falling data output enable signal fouten.

Herein, prior to outputting the rising data output enable signal routen and the falling data output enable signal fouten, there is a delay time corresponding to the CL. That is, after the data output control unit 40 receives the read command performing signal casp_rd, the rising data output enable signal routen and the falling data output enable signal fouten are outputted from the data output control unit 40 after the delay time corresponding to the CL is passed.

Herein, when the rising data output enable signal routen and the falling data output enable signal fouten are outputted, they are synchronized with the delay locked rising edge clock signal rclk_dll and the delay locked falling edge clock signal fclk_dll. The rising data output enable signal routen and the falling data output enable signal fouten respectively serve to output the data synchronously with a rising edge of the clock signal iclk and a falling edge of the clock signal iclk.

The data output buffer 50 receives the data from the memory core block 80 for outputting the received data to the D0 pad in response to the rising data output enable signal routen and the falling data output enable signal fouten.

FIG. 2 is a block diagram showing the data output control unit 40 shown in FIG. 1.

As shown, the data output control unit 40 includes an internal signal generating unit 41, a first signal shift unit 42, a second signal shift unit 43, a rising data output control unit 44 and a falling data output control unit 45.

The internal signal generating unit 41 receives the read command performing signal casp_rd for generating an internal signal oe00 by synchronizing the read command performing signal casp_rd with the clock signal iclk.

The first signal shift unit 42 receives the internal signal oe00 and the delay locked rising edge clock signal rclk_dll for shifting the internal clock signal oe00 synchronizing with the delay locked rising edge clock signal rclk_dll, whereby the first signal shift unit 42 outputs a first, a second, a third and a fourth shifted delay locked rising edge clock signals oe10_dll, oe20_dll, oe30_dll and oe40_dll.

That is, the internal signal oe00 is synchronized with a first to a fourth rising edges of the delay locked rising edge clock signal rclk_dll to be respectively outputted as the first to the fourth shifted delay locked rising edge clock signals oe10_dll to oe40_dll.

Likewise, the second signal shift unit 43 receives the internal signal oe00 and the delay locked falling edge clock signal fclk_dll for shifting the internal clock signal oe00 synchronizing with the delay locked falling edge clock signal fclk_dll, whereby the second signal shift unit 43 outputs a first, a second, a third and a fourth shifted delay locked rising edge clock signals oe15_dll, oe25_dll, oe35_dll and oe45_dll.

That is, the internal clock signal oe00 is synchronized with a first to a fourth rising edges of the delay locked falling edge clock signal fclk_dll to be respectively outputted as the first to the fourth shifted delay locked falling edge clock signals oe15_dll to oe45_dll.

The rising data output control unit 44 receives the first to the fourth shifted delay locked rising edge clock signals oe10_dll to oe40_dll for outputting one of the received signals as the rising data output enable signal routen depending on the CL. For instance, if the CL is 2, the first shifted delay locked rising edge clock signal oe10_dll is outputted as the rising data output enable signal routen. Likewise, if the CL is 3, 4 or 5, the second, the third or the fourth shifted delay locked rising edge clock signal oe20_dll, oe30_dll or oe40_dll is respectively outputted as the rising data output enable signal routen.

Likewise, falling data output control unit 45 receives the first to the fourth shifted delay locked falling edge clock signals oe15_dll to oe45_dll for outputting one of the received signals as the falling data output enable signal fouten depending on the CL. That is, if the CL is 2, 3, 4 or 5, the first, the second, the third or the fourth shifted delay locked falling edge clock signal oe15_dll, oe25_dll, oe35_dll or oe45_dll is respectively outputted as the falling data output enable signal fouten.

FIG. 3 is a schematic circuit diagram showing the first signal shift unit 42 shown in FIG. 2.

As shown, the first signal shift unit 42 includes a first to a fourth D-type flip-flops F1 to F4.

Each clock input terminal of the first to the fourth D-type flip-flops receives the delay locked rising edge clock signal rclk_dll. The first D-type flip-flop F1 receives the internal signal oe00 through its data input terminal for outputting the first shifted delay locked rising edge clock signal oe10_dll through its main output terminal. An output signal from a sub output terminal of the first D-type flip-flop F1 is inputted to a data input terminal of the second D-type flip-flop F2, and the second D-type flip-flop F2 outputs the second shifted delay locked rising edge clock signal oe20_dll through its main output terminal.

Likewise, output signals from sub output terminals of the second and the third D-type flip-flops F2 and F3 are respectively inputted to data input terminals of the third and the fourth D-type flip-flop F3 and F4, and the third and the fourth D-type flip-flops F3 and F4 output the third and the fourth shifted delay locked rising edge clock signals oe30_dll and oe40_dll.

Herein, the second signal shift unit 43 has the same structure as that of the first signal shift unit 42. Therefore, detailed description of the second signal shift unit 43 is omitted.

FIG. 4 is a timing diagram showing an operation of the data output control unit 40 shown in FIG. 2.

The operation of the data output control unit 40 is described below referring to FIGS. 1 to 4.

The internal signal generating unit 41 receives the read command performing signal casp_rd for generating the internal signal oe00 by synchronizing the read command performing signal casp_rd with the clock signal iclk.

Thereafter, the first signal shift unit 42 receives the internal signal oe00 and the delay locked rising edge clock signal rclk_dll for generating the first to the fourth shifted delay locked rising edge clock signals oe10_dll to oe40_dll by synchronizing the internal signal oe00 with four consecutive rising edges of the delay locked rising edge clock signal rclk_dll.

Then, the rising data output control unit 44 receives the first to the fourth shifted delay locked rising edge clock signals oe10_dll to oe40_dll and selects one of the received signals depending on the CL for outputting the selected signal as the rising data output enable signal routen.

Meanwhile, the second signal shift unit 43 and the falling data output control unit 45 perform the same operations of the first signal shift unit 42 and the rising data output control unit 44 in order to output the falling data output enable signal fouten.

As described above, the rising data output enable signal routen and the falling data output enable signal fouten are important signals which determine a timing of outputting data. Since the DDR synchronous semiconductor memory device performs the data access operation at both edges of a clock signal, the DDR synchronous semiconductor memory device should be provided with a rising data output control unit and a falling data output control unit for generating the rising data output enable signal and the falling data output enable signal respectively.

Therefore, size of a data output control circuit is increased and power consumption is also increased.

SUMMARY OF INVENTION

It is, therefore, an object of the present invention to provide a data output control circuit capable of generating a rising data output enable signal and a falling data output enable signal for reducing power consumption and for decreasing size of a synchronous semiconductor memory device.

In accordance with an aspect of the present invention, there is provided a data output control circuit for use in a synchronous semiconductor memory device including: a first data output enable signal generation unit for receiving an internal signal and generating a rising data output enable signal synchronizing with a rising edge of a DLL clock signal according to a CAS latency; and a second data output enable signal generation unit for receiving the rising data output enable signal and generating a falling data output enable signal synchronizing with a falling edge of the DLL clock signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a data output control circuit for use in a synchronous semiconductor memory device in accordance with the present invention will be described in detail referring to the accompanying drawings.

Figure 1:
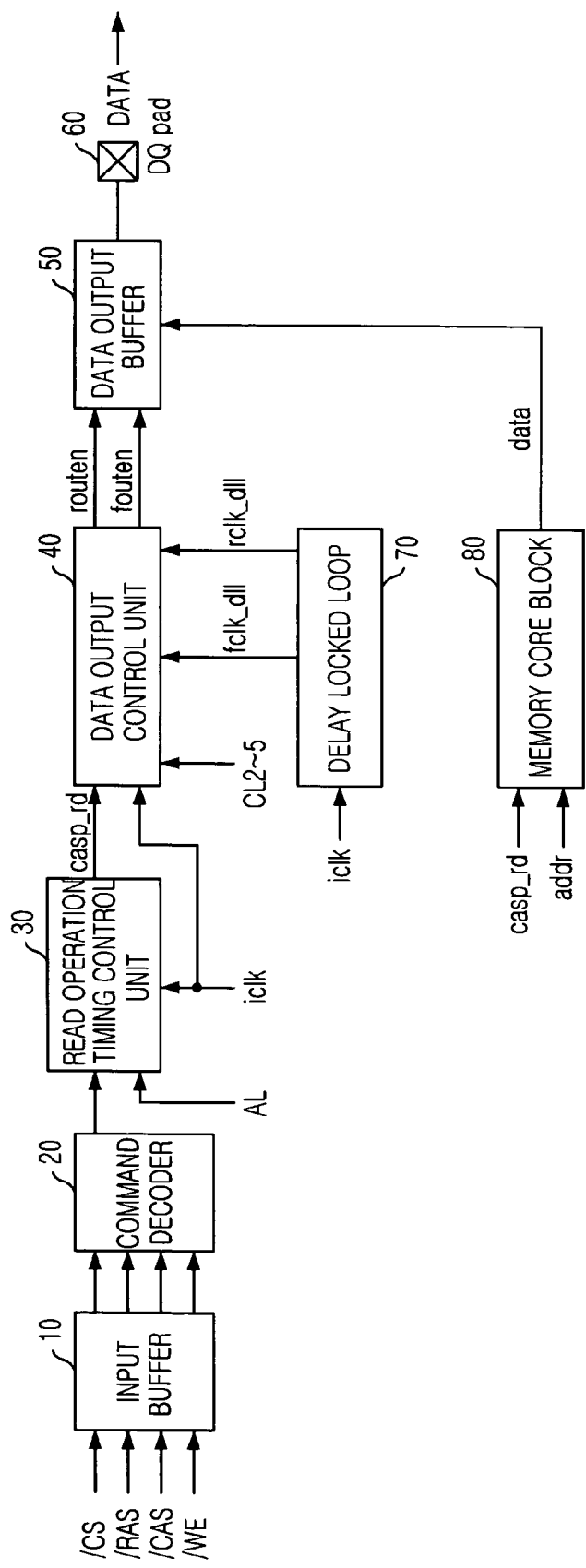
FIG. 1 is a block diagram showing a conventional synchronous semiconductor memory device.
Figure 2:
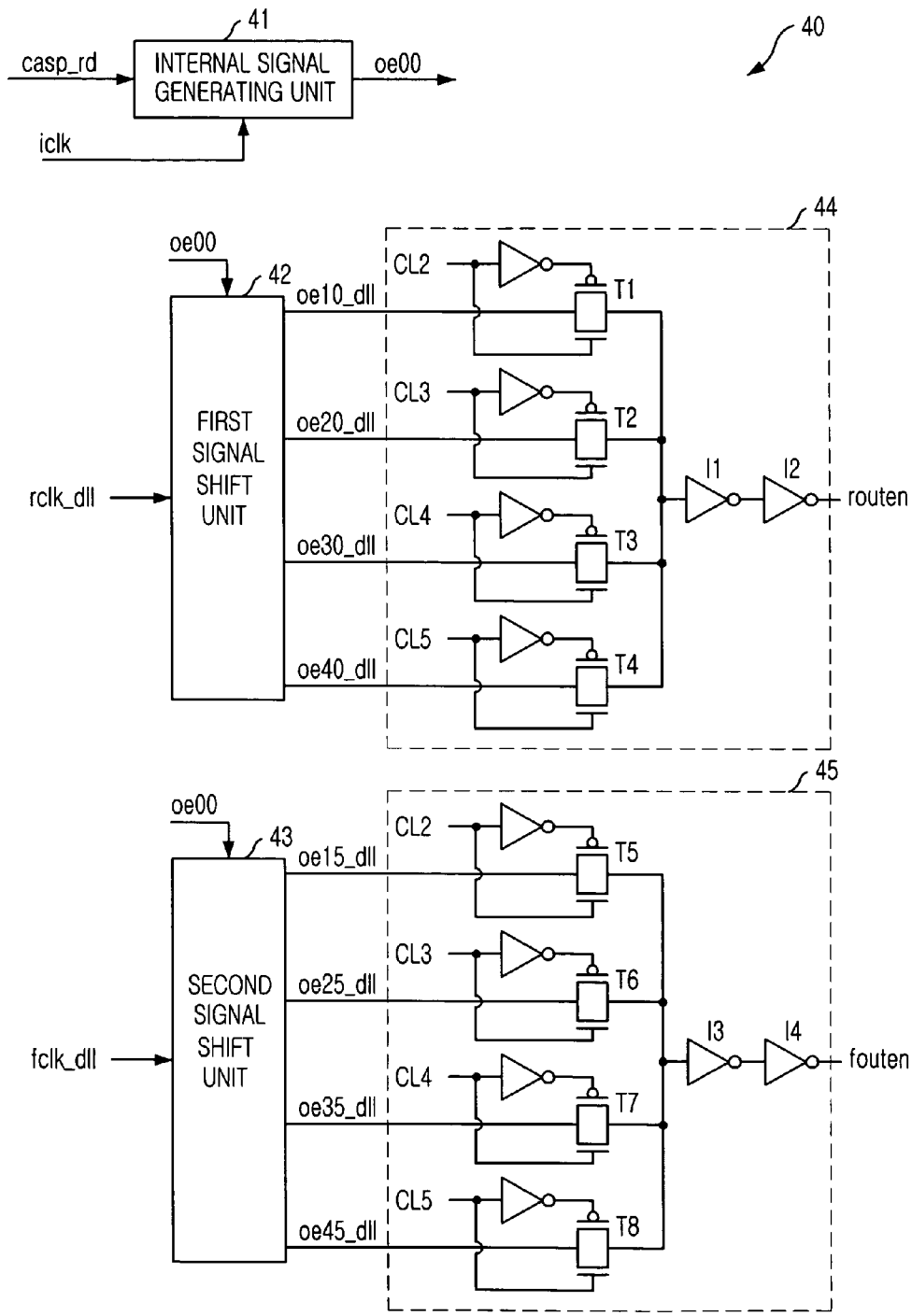
FIG. 2 is a block diagram showing a data output control unit shown in FIG. 1.
Figure 3:
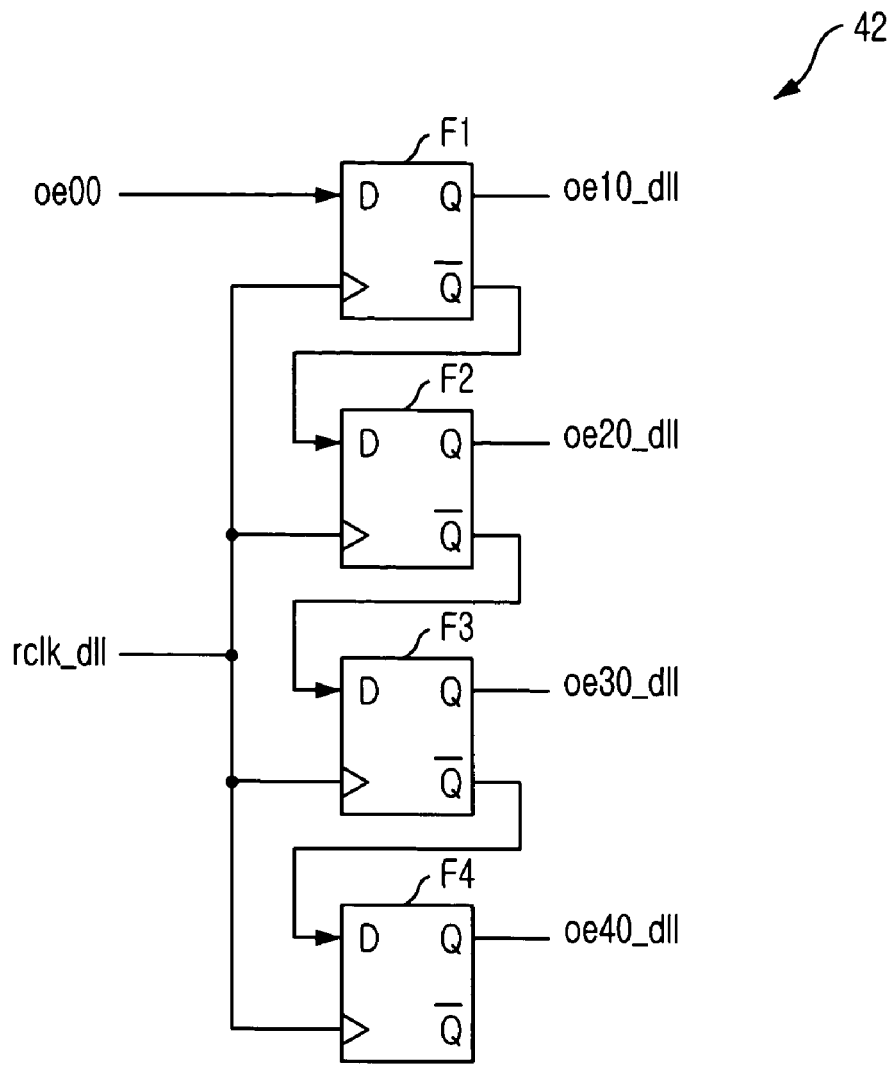
FIG. 3 is a schematic circuit diagram showing a first signal shift unit shown in FIG. 2.
Figure 4:
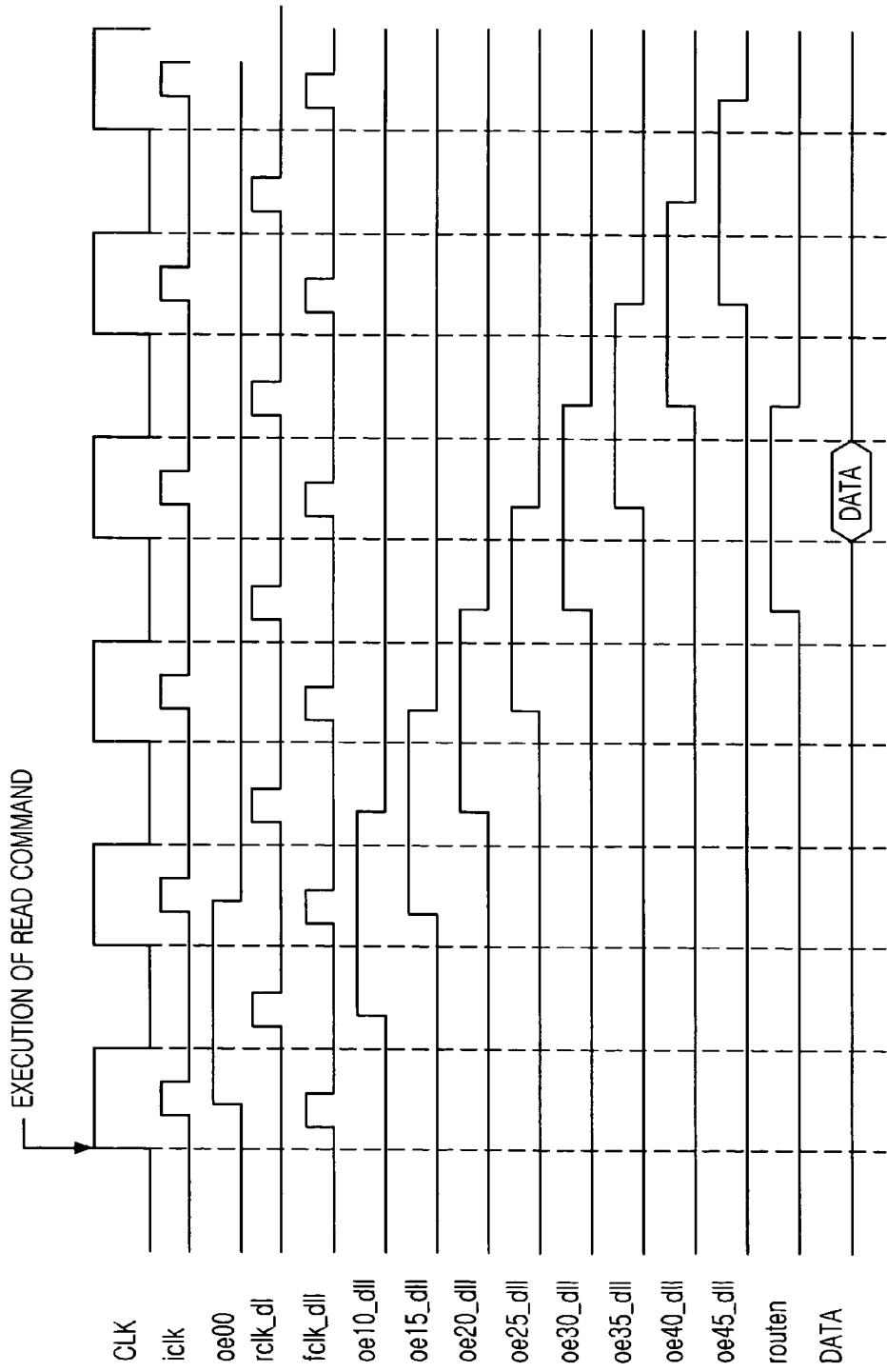
FIG. 4 is a timing diagram showing an operation of a data output control unit shown in FIG. 2.
Figure 5:
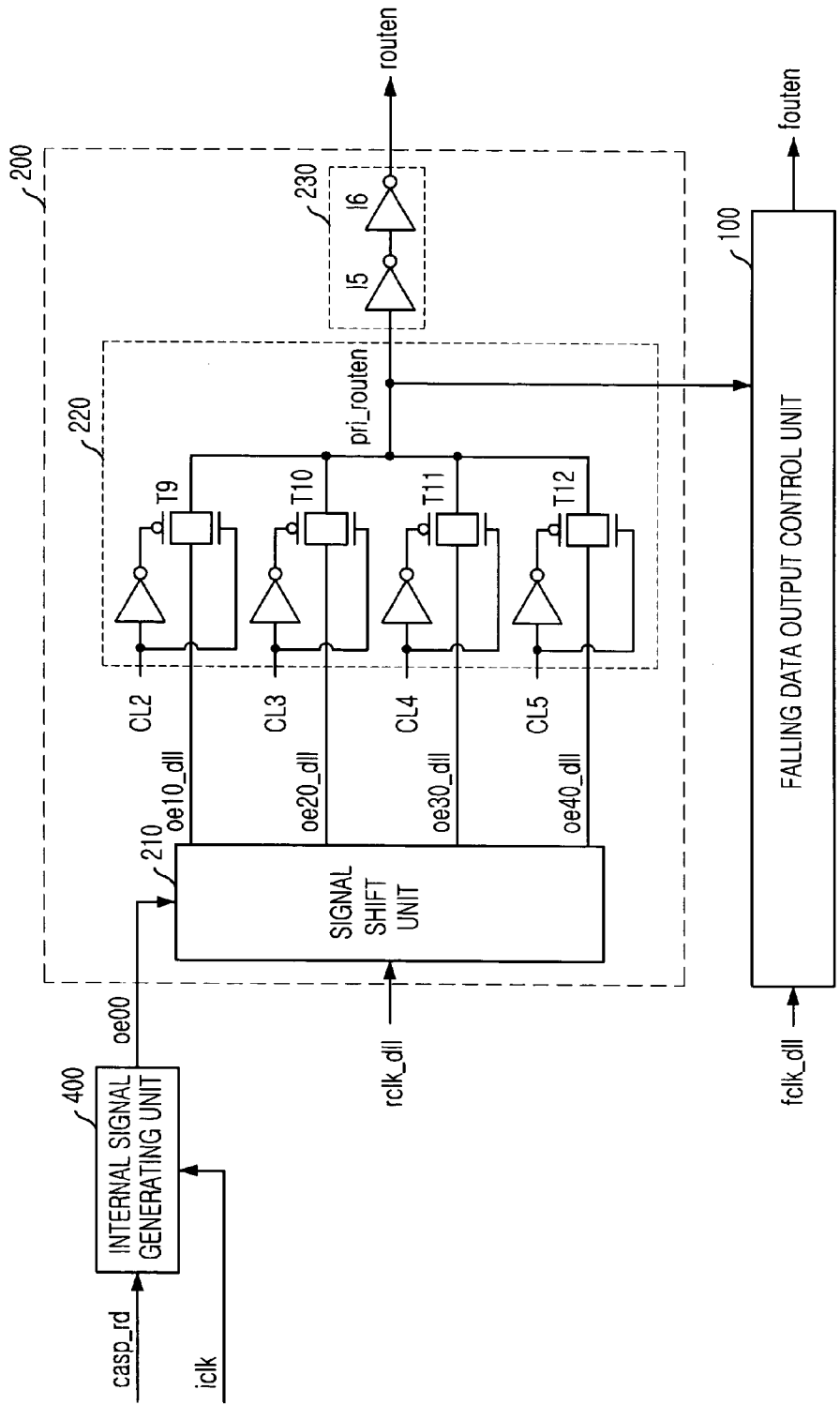
FIG. 5 is a block diagram showing a data output control circuit in accordance with a preferred embodiment of the present invention.

FIG. 5 is a block diagram showing a data output control circuit in accordance with a preferred embodiment of the present invention.

As shown, the data output control circuit includes an internal signal generating unit 400, a rising data output control unit 200 and a falling data output control unit 100.

The internal signal generating unit 400 receives a read command performing signal casp_rd and a clock signal iclk for generating an internal signal oe00 by synchronizing the read command performing signal casp_rd with the clock signal iclk.

The rising data output control unit 200 receives the internal signal oe00 and a delay locked rising edge clock signal rclk_dll for generating a rising data output enable signal routen in response to a CAS latency (CL).

Likewise, the falling data output control unit 100 receives a primitive rising data output enable signal pri_routen from the rising data output control unit 200 and also receives a delay locked falling edge clock signal fclk_dll for generating a falling data output enable signal fouten.

The two data output enable signals, i.e., the rising data output enable signal routen and the falling data output enable signal fouten, are used as control signals for a data output buffer to output data.

Meanwhile, the rising data output control unit 200 includes a signal shift unit 210, a signal selection unit 220 and a first buffering unit 230.

The signal shift unit 210 receives the internal signal oe00 and the delay locked rising edge clock signal rclk_dll for shifting the internal clock signal oe00 synchronizing with the delay locked rising edge clock signal rclk_dll, whereby to output a first, a second, a third and a fourth shifted delay locked rising edge clock signals oe10_dll, oe20_dll, oe30_dll and oe40_dll.

That is, the internal signal oe00 is synchronized with a first to a fourth rising edges of the delay locked rising edge clock signal rclk_dll to be respectively outputted as the first to the fourth shifted delay locked rising edge clock signals oe10_dll to oe40_dll.

The signal selection unit 220 includes a plurality of inverters and a plurality of transferring gates T9 to T12 for selecting one of the shifted delay locked rising edge clock signals oe10_dll to oe40_dll and for outputting the selected signal as the primitive rising data output enable signal pri_routen depending on the CL.

That is, one of the plurality of transferring gates T9 to T12 is turned on depending on the CL, and one of the shifted delay locked rising edge clock signals oe10_dll to oe40_dll which is connected to the turn-on transferring gate is outputted as the primitive rising data output enable signal pri_routen. For instance, if the CL is 2, the transferring gate T9 is turned on; and, thus, the shifted delay locked rising edge clock signal oe10_dll is outputted as the primitive rising data output enable signal pri_routen.

The first buffering unit 230 includes two inverters I5 and I6 for receiving the primitive rising data output enable signal pri_routen. The first buffering unit 230 outputs the received primitive rising data output enable signal pri_routen as the rising data output enable signal routen after buffering the primitive rising data output enable signal pri_routen.

Figure 6:
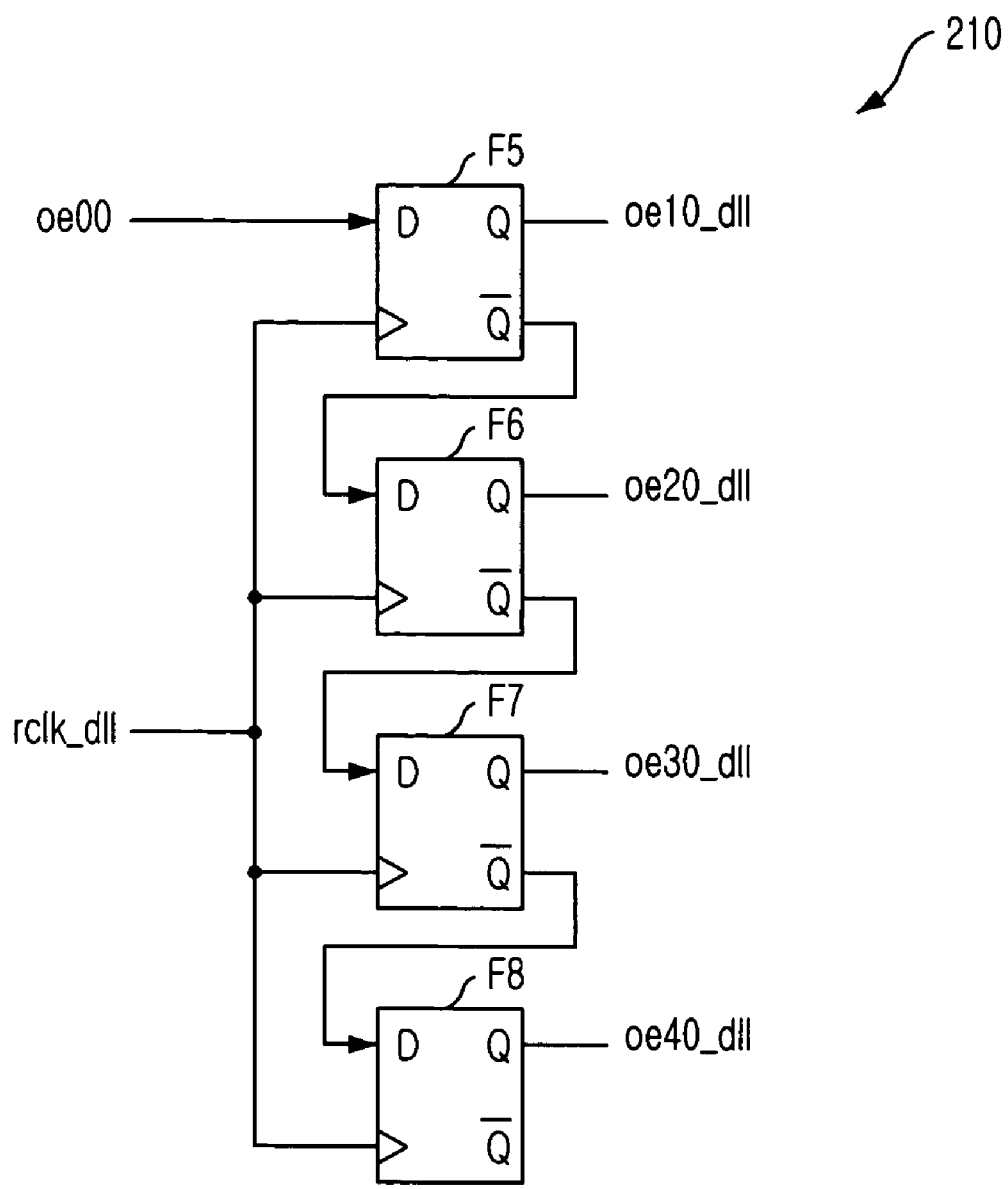
FIG. 6 is a schematic circuit diagram showing a signal shift unit shown in FIG. 5.

FIG. 6 is a schematic circuit diagram showing the signal shift unit 210 shown in FIG. 5.

As shown, the signal shift unit 210 includes a first to a fourth D-type flip-flops F5 to F8.

Each clock input terminal of the first to the fourth D-type flip-flops receives the delay locked rising edge clock signal rclk_dll. The first D-type flip-flop F5 receives the internal signal oe00 through its data input terminal for outputting the first shifted delay locked rising edge clock signal oe10_dll through its main output terminal. An output signal from a sub output terminal of the first D-type flip-flop F5 is inputted to a data input terminal of the second D-type flip-flop F6, and the second D-type flip-flop F6 outputs the second shifted delay locked rising edge clock signal oe20_dll through its main output terminal.

Likewise, output signals from sub output terminals of the second and the third D-type flip-flops F6 and F7 are respectively inputted to data input terminals of the third and the fourth D-type flip-flops F7 and F8, and the third and the fourth D-type flip-flops F7 and F8 output the third and the fourth shifted delay locked rising edge clock signals oe30_dll and oe40_dll.

Figure 7:
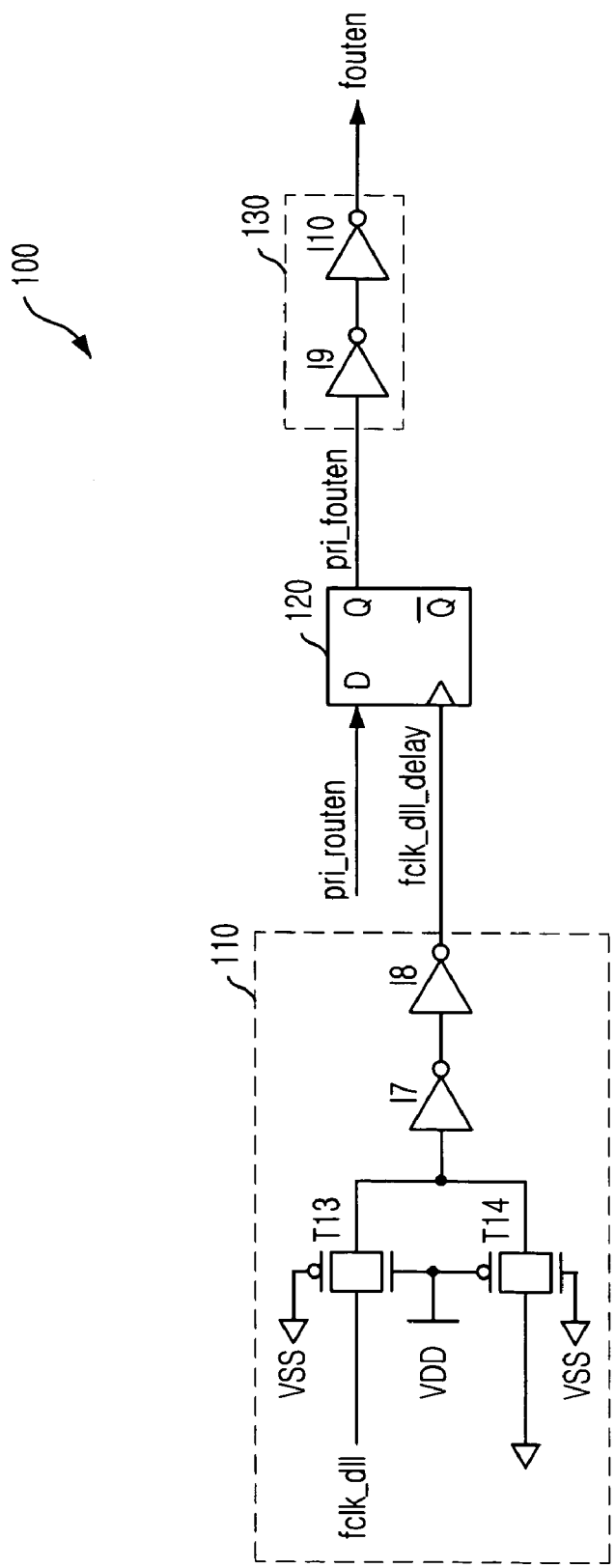
FIG. 7 is a block diagram showing a falling data output control unit shown in FIG. 5.

FIG. 7 is a block diagram showing the falling data output control unit 100 shown in FIG. 5.

As shown, the falling data output control unit 100 includes a delay unit 110, a clock synchronizing unit 120 and a second buffering unit 130.

The delay unit 110 delays the delay locked falling edge clock signal fclk_dll for a predetermine delay time and outputs the delayed signal as a delayed delay locked falling edge clock signal fclk_dll_delay. Herein, the predetermined delay time is equal to a delay time which is spent while the delay locked rising edge clock signal rclk_dll is passed through the signal shift unit 210 and the signal selection unit 220.

The delay unit 110 includes two transferring gates T13 and T14 for delaying the delay locked falling edge clock signal fclk_dll for a first delay time which is spent while the delay locked rising edge clock signal rclk_dll is passed through the signal selection unit 220, and the delay unit 110 also includes two inverters I7 and I8 for delaying the delay locked falling edge clock signal fclk_dll for a second delay time which is spent while the delay locked rising edge clock signal rclk_dll is passed through the signal shift unit 210.

The clock synchronizing unit 120 receives the primitive rising data output enable signal pri_routen and the delayed delay locked falling edge clock signal fclk_dll_delay for generating a primitive falling data output enable signal pri_fouten by synchronizing the primitive rising data output enable signal pri_routen with the delayed delay locked falling edge clock signal fclk_dll_delay.

The second buffering unit 130 receives and buffers the primitive falling data output enable signal pri_fouten to output the falling data output enable signal fouten.

An operation of the data output control circuit in accordance with the preferred embodiment of the present invention is described below referring to FIGS. 5 to 7.

The internal signal generating unit 400 generates the internal signal oe00 by synchronizing the read command performing signal casp_rd with the clock signal iclk.

Thereafter, the signal shift unit 210 shifts the internal clock signal rclk_dll by synchronizing the internal signal oe00 with consecutive four rising edges of the delay locked rising edge clock signal rclk_dll to thereby output the first to the fourth shifted delay locked rising edge clock signals oe10_dll to oe40_dll.

Thereafter, the signal selection unit 220 receives the first to the fourth shifted delay locked rising edge clock signals oe10_dll to oe40_dll and selects one of the received signals depending on the CL to thereby output the selected signal as the primitive rising data output enable signal pri_routen.

The buffering unit 230 receives the primitive rising data output enable signal pri_routen and outputs the received primitive rising data output enable signal pri_routen as the rising data output enable signal routen after buffering the primitive rising data output enable signal pri_routen.

Meanwhile, the falling data output control unit 100 receives the primitive rising data output enable signal pri_routen and the delay locked falling edge clock signal fclk_dll for delaying the delay locked falling edge clock signal fclk_dll for the predetermined delay time; and, thus, to output the delayed delay locked falling edge clock signal fclk_dll_delay. Then, the falling data output control unit 100 synchronizes the primitive rising data output enable signal pri_routen with the delayed delay locked falling edge clock signal fclk_dll_delay to output the falling data output enable signal fouten.

Herein, the falling data output control unit 100 includes the delay unit 110, the clock synchronizing unit 120 and the second buffering unit 130.

The delay unit 110 delays the delay locked falling edge clock signal fclk_dll for the predetermined delay time which is spent while the delay locked rising edge clock signal rclk_dll is passed through the signal shift unit 210 and the signal selection unit 220, whereby the delay unit 110 outputs the delayed signal as the delayed delay locked falling edge clock signal fclk_dll_delay.

The clock synchronizing unit 120 receives the primitive rising data output enable signal pri_routen and the delayed delay locked falling edge clock signal fclk_dll_delay for generating the primitive falling data output enable signal pri_fouten by synchronizing the primitive rising data output enable signal pri_routen with the delayed delay locked falling edge clock signal fclk_dll_delay.

Thereafter, the second buffering unit 130 receives and buffers the primitive falling data output enable signal pri_fouten to output the falling data output enable signal fouten.

As described above, since the data output control circuit generates the falling data output enable signal fouten using the rising data output enable signal routen, a circuit block for generating the falling data output enable signal, i.e., the falling data output control unit 100 is not required to include a plurality of flip-flops or a plurality of transferring gates.

As a result, a semiconductor memory device can reduce its size and power consumption using the data output control circuit in accordance with the present invention.

The present application contains subject matter related to Korean patent application No. 2003-76835, filed in the Korean Patent Office on Oct. 31, 2003, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A data output control circuit for use in a semiconductor memory device, comprising:

a first data output enable signal generation unit for receiving an internal signal and generating a rising data output enable signal synchronizing with a rising edge of a DLL clock signal according to a CAS latency; and a second data output enable signal generation unit for receiving the rising data output enable signal and generating a falling data output enable signal synchronizing with a falling edge of the DLL clock signal.

2. The data output control circuit as recited in claim 1, further comprising an internal signal generation unit for receiving a clock signal and a read command performing signal in order to output the internal signal, which is synchronized with the read command performing signal, to the first data output enable signal generation unit.

3. The data output control circuit as recited in claim 1, wherein the first data output enable signal generation unit further includes a delay unit for delaying the rising data output enable signal by a predetermined delay amount.

4. The data output control circuit as recited in claim 3, wherein, in the second data output enable signal generation unit, the falling edge of the DLL clock signal is delayed by the predetermined delay amount.

5. The data output control circuit as recited in claim 4, wherein the first data output enable signal generation unit includes:

a signal shifting means including a plurality of D-type flip-flops for receiving the internal signal and the rising edge of the DLL clock signal, in order to output a plurality of shifted signals; and a signal selection unit including a plurality of transferring gates which receive the plurality of shifted signals and are selectively turned on in order to output one of the plurality of shifted signals as the rising data output enable signal depending on the CAS latency, wherein a first D-type flip-flop among the plurality of D-type flip-flops receives the internal signal through its data input terminal and an output signal from a sub output terminal of a previous D-type flip-flops is inputted to a data input terminal of a next D-type flip-flop.

6. The data output control unit as recited in claim 5, wherein the second data output enable signal generation unit includes:

a delay unit which delays the falling edge of the DLL clock signal for the predetermined delay amount;

a clock synchronizing unit which receives the delayed falling edge of the DLL clock signal and the rising data output enable signal for outputting the rising data output enable signal in synchronization with the delayed falling edge of the DLL clock signal; and a second buffering means which receives an output signal of the clock synchronizing unit for buffering the received signal in order to output the buffered signal as the falling data output enable signal.

7. The data output control unit as recited in claim 6, wherein the clock synchronizing unit includes a D-type flip-flop which receives the delayed falling edge of the DLL clock signal through its clock input terminal and the rising data output enable signal of the signal selection unit through its data input terminal.

* * * * *